United States Patent
Belyansky et al.

(10) Patent No.: US 9,929,012 B1
(45) Date of Patent: Mar. 27, 2018

(54) RESIST HAVING TUNED INTERFACE HARDMASK LAYER FOR EUV EXPOSURE

(71) Applicant: International Business Machines Corporation, Armonk, NY (US)

(72) Inventors: Michael P Belyansky, Bethel, CT (US); Ravi K Bonam, Albany, NY (US); Anuja Desilva, Slingerlands, NY (US); Scott Halle, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/378,655

(22) Filed: Dec. 14, 2016

(51) Int. Cl.
*H01L 21/266* (2006.01)
*H01L 21/31* (2006.01)
*H01L 21/32* (2006.01)
*H01L 21/426* (2006.01)
*H01L 21/033* (2006.01)
*H01L 21/02* (2006.01)

(52) U.S. Cl.
CPC ...... *H01L 21/0337* (2013.01); *H01L 21/0228* (2013.01); *H01L 21/02172* (2013.01); *H01L 21/02266* (2013.01); *H01L 21/02323* (2013.01); *H01L 21/02356* (2013.01); *H01L 21/0332* (2013.01)

(58) Field of Classification Search
CPC ......... H01L 21/28123; H01L 21/31144; H01L 21/0337; H01L 21/0332; H01L 21/02172; H01L 21/02274; H01L 21/0274; H01L 21/0279; H01L 21/02266; H01L 21/0228; H01L 21/02356
See application file for complete search history.

(56) References Cited

U.S. PATENT DOCUMENTS 8,257,910 B1  9/2012  Guerrero et al.
8,968,989 B2  3/2015  Ouattara et al.
(Continued)

OTHER PUBLICATIONS

Masson, "Cobalt-containing polymers as patterning assist layers in extreme ultraviolet lithography". SPIE Symp. Advanced Lithography, pp. 763631-1 to 10 (2010).
(Continued)

*Primary Examiner* — Jasmine Clark
(74) *Attorney, Agent, or Firm* — Harrington & Smith

(57) ABSTRACT

A method is disclosed to prepare a substrate for photolithography. The method includes forming an underlayer over a surface of the substrate; depositing an interface hardmask layer on the underlayer using one of a vapor phase deposition process or an atomic layer deposition process; and forming a layer of extreme UV (EUV) resist on the interface hardmask layer, where the interface hardmask layer is comprised of material having a composition and properties tuned to achieve a certain secondary electron yield from the interface hardmask layer. Also disclosed is a structure configured for photolithography. The structure includes a substrate; an underlayer over a surface of the substrate; an interface hardmask layer disposed on the underlayer; and a layer of EUV resist disposed on the interface hardmask layer. The interface hardmask layer contains material having a composition and properties tuned to achieve a certain secondary electron yield from the interface hardmask layer.

18 Claims, 8 Drawing Sheets

(56) References Cited

U.S. PATENT DOCUMENTS

| | | |
|---|---|---|
| 2009/0297784 A1 | 12/2009 | Xu et al. |
| 2012/0088369 A1 | 4/2012 | Weidman et al. |
| 2012/0328990 A1 | 12/2012 | Yao et al. |
| 2014/0187044 A1* | 7/2014 | Tsai .................. H01L 21/3065 438/694 |
| 2014/0193757 A1 | 7/2014 | Ogihara et al. |
| 2014/0235796 A1 | 8/2014 | Ogihara et al. |
| 2016/0251546 A1 | 9/2016 | Nakajima et al. |
| 2017/0092495 A1* | 3/2017 | Chen .................. H01L 21/0273 |

OTHER PUBLICATIONS

Ouattara et al., "EUV assist layers for use in multilayer processes", SPIE Advanced Lithography Symp, pp. 83222E-1 to 7 (2012).

Grenville et al, "Integrated fab process for metal oxide EUV photoresist", SPIE Advanced Lithography Symp., pp. 94250S-1 to 8 (2015).

Padmanaban et al., "Functional Properties of Novel Metallic Hard Masks". Jour. of Photopolymer Science and Technology, 26(2), pp. 231-238 (2013).

Yao et al., "New Spin-on Metal Hardmask Materials for Lithography Processes", SPIE Advanced Lithography Symp., pp. 86820s-1 to 10 (2013).

Stowers et al., "Metal oxide EUV photoresist performance for N7 relevant patterns and processes", SPIE Advanced Lithography Symp., pp. 977904-1 to 10 (2016).

De Simone et al., "Demonstration of an N7 integrated fab process for metal oxide EUV photoresist", SPIE Advanced Lithography Symp.pp. 97760B-1 to 9 (2016).

Stowers et al., "Directly patterned inorganic hardmask for EUV lithography", SPIE Advanced Lithography Symp.pp. 796915-1 to 11 (2011).

Walker et al. "The Secondary Electron Emission Yield for 24 Solid Elements Excited by Primary Electrons in the Range 250-500 ev: A Theory/Experiment Comparison" Department of Electronics, University of York, Heslington, York, United Kingdom.

* cited by examiner

SECONDARY ELECTRON YIELDS FOR COMMON METALS

| Z | ATOM | $\delta^m$ | $E_{PE}^m$ (eV) |
|---|---|---|---|
| 3 | Li | 0.5–0.6 | 100–200 |
| 4 | Be | 0.5–0.9 | 200–300 |
| 5 | B | 1.0–1.2 | 150–400 |
| 6 | C | 0.9–1.0 | 300–1100 |
| 11 | Na | 0.65 | 300 |
| 12 | Mg | 0.8–0.9 | 300 |
| 13 | Al | 0.9–1.0 | 250–300 |
| 14 | Si | 0.9–1.1 | 250–300 |
| 15 | P | (1.2) | (550) |
| 16 | S | (1.2) | (560) |
| 19 | K | 0.5–0.7 | 300 |
| 20 | Ca | (0.85) | (390) |
| 21 | Sc | 0.8 | 300 |
| 22 | Ti | 0.7–0.9 | 300 |
| 23 | V | (1.0) | (470) |
| 24 | Cr | (1.0) | (480) |
| 25 | Mn | (1.0) | (500) |
| 26 | Fe | 1.1–1.3 | 400 |
| 27 | Co | 0.9–1.2 | 400–600 |
| 28 | Ni | 1.0–1.3 | 500–550 |
| 29 | Cu | 1.1–1.3 | 500–600 |
| 30 | Zn | 0.9–1.1 | 200–500 |
| 31 | Ga | 1.3 | 300–500 |
| 32 | Ge | 1.0–1.2 | 300–500 |
| 33 | As | 1.4 | (670) |
| 34 | Se | 0.6–1.3 | 400–500 |
| 37 | Rb | 0.6–0.9 | 350–400 |
| 38 | Sr | 0.8 | 250 |
| 39 | Y | 0.8 | 350–400 |
| 40 | Zr | 0.9–1.1 | 350 |
| 41 | Nb | 1.1–1.2 | 550 |
| 42 | Mo | 1.0–1.2 | 400 |
| 43 | Tc | (1.1) | 560 |
| 44 | Ru | (1.1) | 580 |
| 45 | Rh | (1.1) | 580 |
| 46 | Pd | 1.3 | 650 |

FIG.4C

RESIST HAVING TUNED INTERFACE HARDMASK LAYER FOR EUV EXPOSURE

TECHNICAL FIELD

The embodiments of this invention relate generally to photoresists such as those used during the fabrication of integrated circuits and, more specifically, relate to photoresists that are responsive to ultraviolet (UV) and extreme UV (EUV, e.g., 13.5 nm) optical excitation used during wafer fabrication.

BACKGROUND

Referring to FIGS. 1A, 1B and 1C of FIG. 1, an optical excitation at 193 nm (6.5 eV) is near 'resonantly' tuned to optically excite Photo Active Groups (PAGs) contained in a layer of photoresist (resist). Secondary electrons do not play any significant role in the optical excitation of PAGs at 193 nm. Optical lithography control of a photoresist profile can be maintained by both minimizing back reflections (for example, standing waves) from an underlayer 3 (such as an optical planarizing layer (OPL)) into a resist layer 1 through n,k (real and imaginary parts of the reflection) matching of an anti-reflection (AR) coating interface layer 2. In conventional practice the AR coating can be used to maximize the optical contrast at the interface layer 2 and promote acid-base chemical interaction. In general, acid bases can typically be located at the interface and a controlled amount of reflection (back into the resist layer 1) can be used to clear out the bottom of the resist profile and thus reduce a required photolithographic dose. It can be noted, however, that with EUV excitation of the resist/interface/underlayer the light travels through the layers without experiencing any appreciable reflection at the top or bottom surfaces of the interface layer.

As can be seen in FIG. 1B, there are electron interactions after incident 92 eV photons (13.5 nm) generate photoelectrons during ionization events. Due to photoionization PAG excitation can occur by secondary electrons having energies of less than 10 eV. As is shown in FIG. 1C, the electron inelastic mean free path defines the travel extent of secondary electrons across the resist polymer. The secondary electrons can travel some tens of nanometers and can traverse from the resist layer 1 into the interface layer 2.

In U.S. Pat. No. 8,968,989 B2, "Assist layers for EUV lithography", Ouattara et al. disclose spin-on assist layers for EUV which contain at least 0.01% of metal and up to 70% of metal by weight. The spun-on assist layer can include both silicon and metal oxides and nitrides. The assist layer is generally described as an underlayer that is spun-on below the photoresist layer to enhance patterning with EUV. As the photoresist layer is exposed to EUV radiation the assist layer absorbance is said to be modulated as a source of secondary electron generation.

In U.S. Pat. No. 8,257,910 B1, "Underlayers for EUV lithography", Guerrero et al. disclose spin-on underlayer compositions for EUV formed of thermally cross-linkable materials. In an embodiment metal and/or silicon atoms can be provided in the composition. Preferred metals are said to include those selected from the group consisting of the early transition metals (Groups MB and IVB), with Ti, Zr, and Hf being particularly preferred. The total metal and silicon atoms present in the composition could be from about 4% to about 80% by weight metal. As the photoresist layer is exposed to EUV radiation it is said that the underlayer layer absorbance is modulated as a source of secondary electron generation.

SUMMARY

In accordance with a non-limiting embodiment of this invention there is provided a method to prepare a substrate for photolithography. The method comprises forming an underlayer over a surface of the substrate; depositing an interface hardmask layer on the underlayer using one of a vapor phase deposition process or an atomic layer deposition process; and forming a layer of extreme UV (EUV) resist on the interface hardmask layer, where the interface hardmask layer is comprised of material having a composition and properties tuned to achieve a certain secondary electron yield from the interface hardmask layer.

In the performance of the method the interface hardmask layer is comprised of at least one of Me; MeO; MeC; MeCO; MeN; MeON; and MeCON, where Me stands for a transition metal, and where N is nitrogen, O is oxygen and C is carbon.

In the performance of the method the interface hardmask layer is comprised of at least one of Ti, Al, Ta, Cu, W, Ga, Mn, Co, Hf, La and other metals with higher Z number, oxides of these metals, carbides of these metals, nitrides of these metals and silicides of these metals.

In the performance of the method a thickness of the interface hardmask layer is in a range of about 1 nm to about 10 nm and the step of depositing the interface hardmask layer is accomplished at a temperature less than a melting temperature of a material that comprises the underlayer.

In the performance of the method the interface hardmask layer can be tuned by depositing the interface hardmask layer as a metal oxide layer or by depositing the interface hardmask layer as a metal layer and subsequently oxidizing the metal layer to a predetermined degree of oxidation to optimize a lithographic feature dose to size characteristic.

In the performance of the method the interface hardmask layer can be tuned by implanting ions into the interface hardmask layer, where in a non-limiting embodiment the interface hardmask layer is comprised of a transition metal and is tuned by implanting oxygen ions into the interface hardmask layer and annealing the implanted interface hardmask layer to create an oxidized form of the transition metal.

In the performance of the method the interface hardmask layer can be tuned by at least one of controlling a microstructure of the interface hardmask layer and controlling a degree of crystallinity of the interface hardmask layer ranging from amorphous to polycrystalline to crystalline.

In the performance of the method the interface hardmask layer can be tuned by exposing the deposited interface hardmask layer to at least one plasma.

In the performance of the method the interface hardmask layer can be tuned by controlling binary x,y or ternary x, y and z relative composition values of elements that comprise the interface hardmask layer.

In accordance with a further non-limiting embodiment of this invention there is provided structure that is configured for photolithography. The structure comprises a substrate; an underlayer over a surface of the substrate; an interface hardmask layer disposed on the underlayer; and a layer of extreme UV (EUV) resist disposed on the interface hardmask layer. In the structure the interface hardmask layer is comprised of material having a composition and properties tuned to achieve a certain secondary electron yield from the interface hardmask layer.

BRIEF DESCRIPTION OF THE SEVERAL VIEWS OF THE DRAWINGS

FIG. 2B illustrates how backscatter secondary electron (BSE) yield scales with atomic number, respectively.

FIGS. 4A-4C, collectively referred to as FIG. 4, that show an electron beam circuit model for electron component measurements; backscatter secondary electron (BSE) yield vs. landing energy for several metals, secondary electron (SE) yield vs. landing energy for the same metals and total electron yield vs. atomic number; and a list of common metals and their associated SE yield, respectively.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

In contradistinction to conventional approaches, such as those disclosed by the above-mentioned Ouattara et al. and Guerrero et al., the embodiments of this invention enable deposition of a thin interface hardmask layer with 100% metal/metal oxides, where the interface hardmask layer allows direct reactive ion etch (RIE) and patterning to be performed. The embodiments of this invention further enable a reduction in critical dimensions to be achieved with improved dose-to-size ratios, while improving adhesion and pattern collapse issues.

Figure 1A:
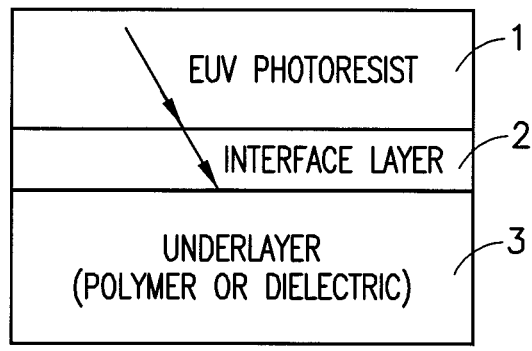
FIGS. 1A, 1B and 1C, collectively referred as FIG. 1, show an enlarged cross-sectional view of a conventional EUV photoresist layer, an interface layer and an underlayer; electron interactions subsequent to incident 92 eV photons generating photoelectrons; and electron inelastic mean free path λ plotted as Angstroms (Å) vs. energy (eV), respectively.
Figure 1B:
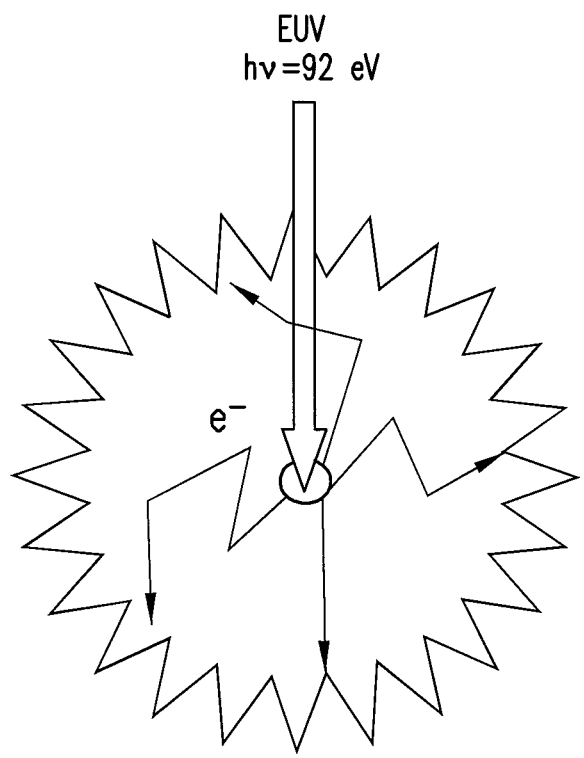
Figure 1C:
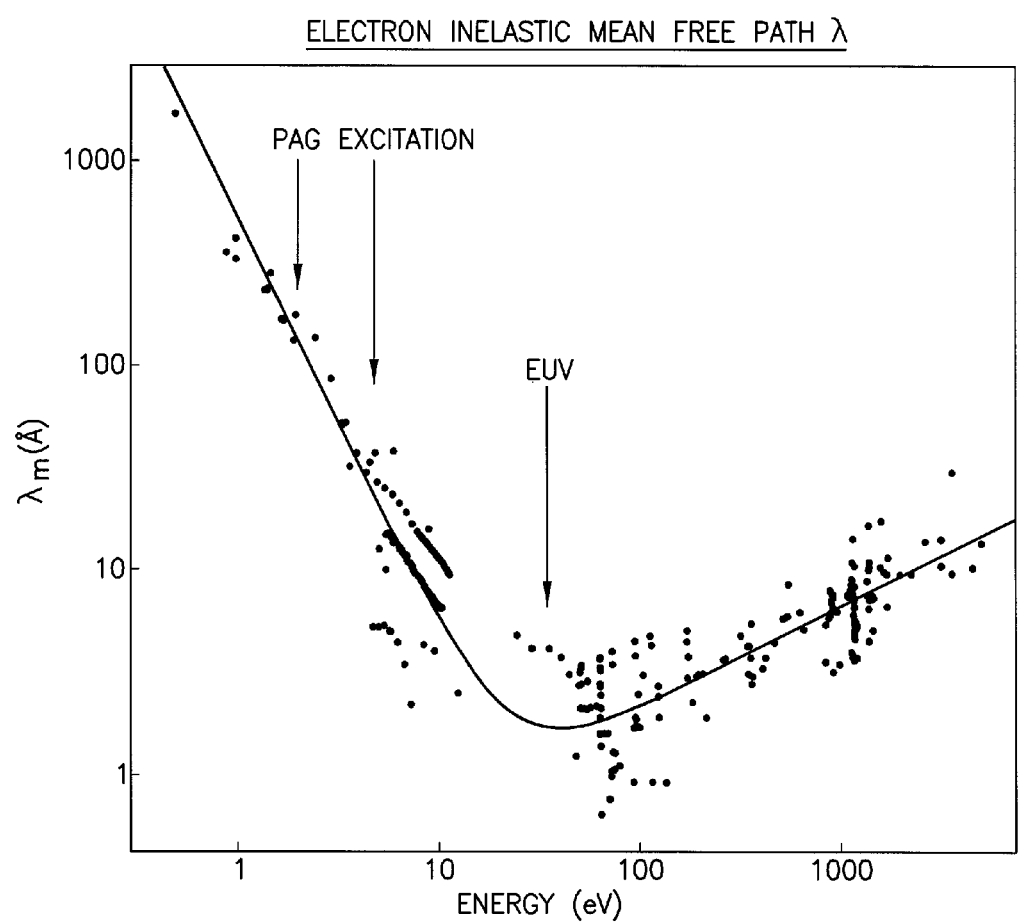
Figure 2A:
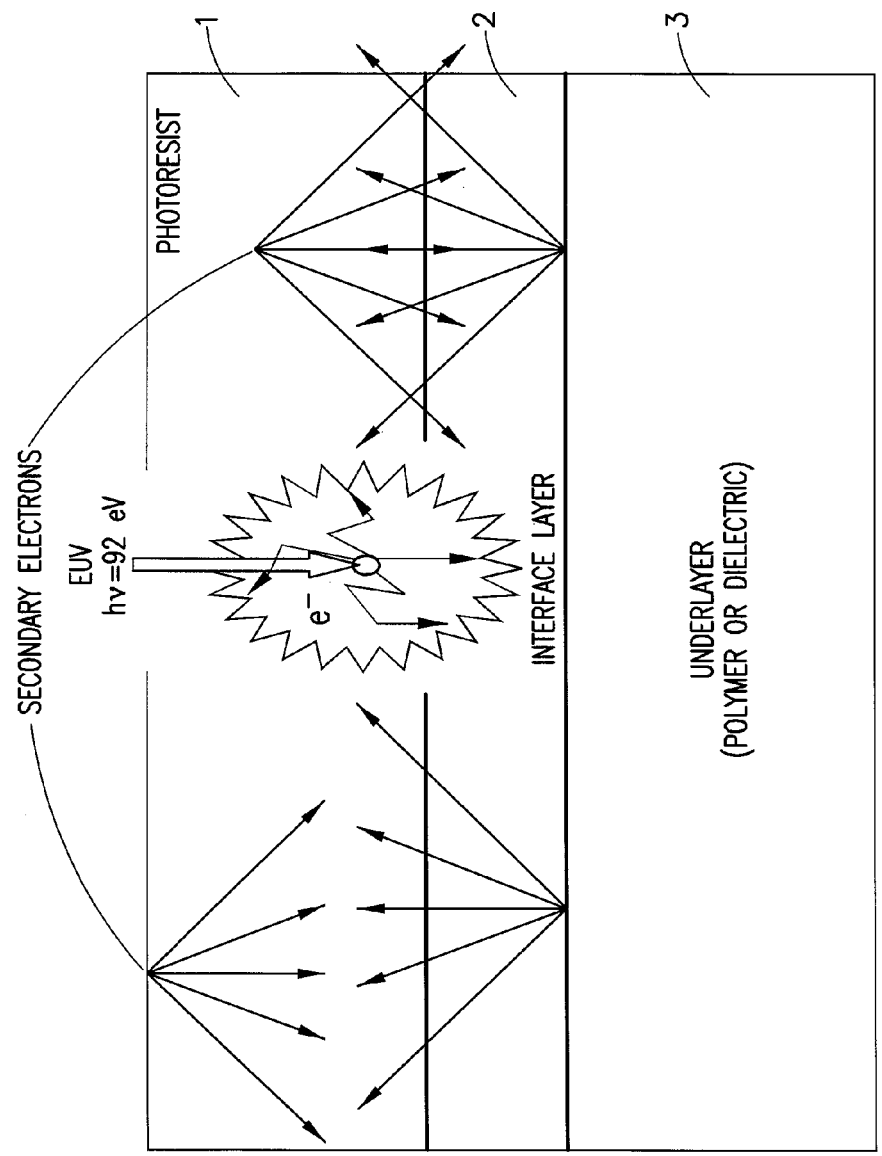
FIGS. 2A and 2B, collectively referred to as FIG. 2, show that secondary electrons can traverse from the photoresist layer into the interface layer and from the interface layer into the photoresist layer.

Referring to FIG. 2A it is shown that the secondary electrons can traverse from the resist 1 into interface layer 2 of the underlayer 3. In general only some finite number of photons is absorbed into the polymer resist layer 1 depending on absorption constants of the resist polymer and the resist photoionization cross-sections. Secondary electron excitations can occur in the layer below the resist, at the interface layer 2 and in a thin width of the underlayer 3. In addition, low energy secondary electrons in the layer below the resist 1 can traverse back into the resist layer 1, interacting there with un-reacted PAGs. While these secondary electrons can have the effect of decreasing the resist contrast, they can also beneficially aid in clearing out the PAGs from the resist at the bottom portions of poor contrast features.

Figure 2B:
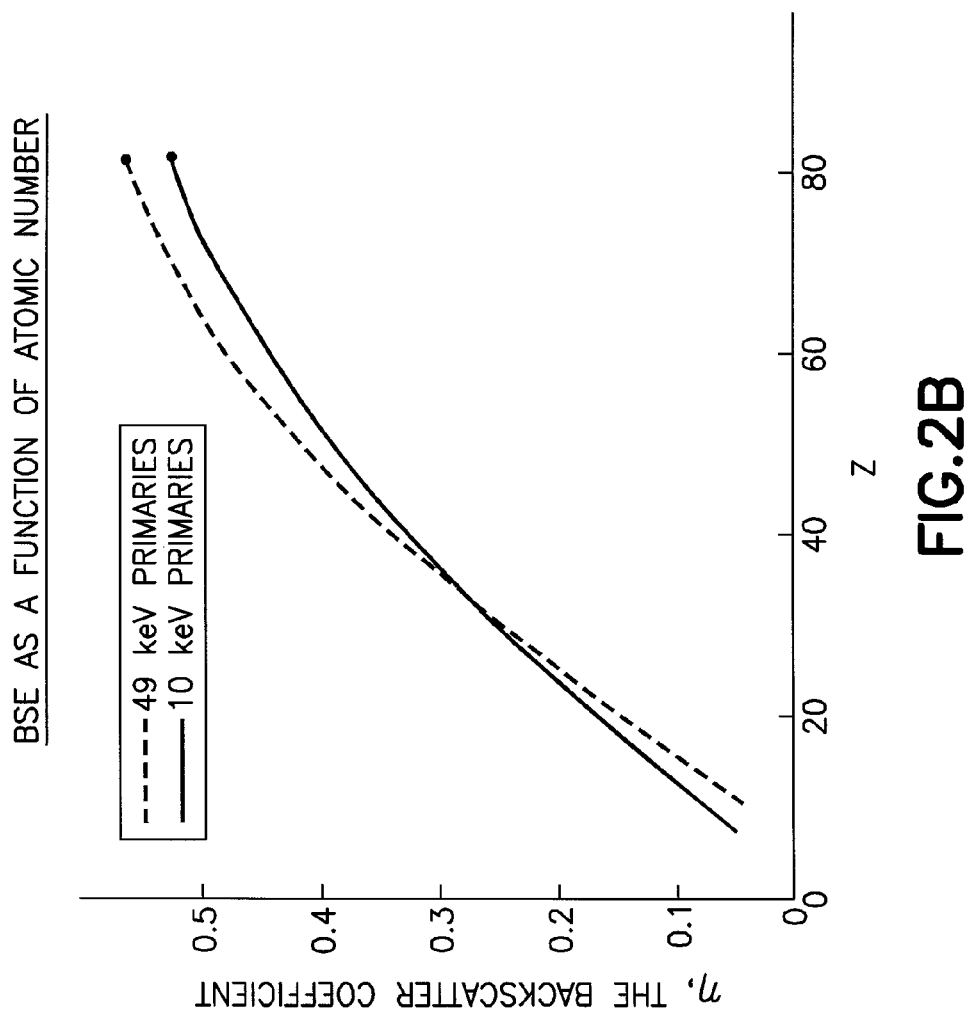

FIG. 2B illustrates how the backscatter secondary electron (BSE) yield scales with atomic number. For phases containing more than one element the backscatter coefficient is the average atomic number.

Figure 3:
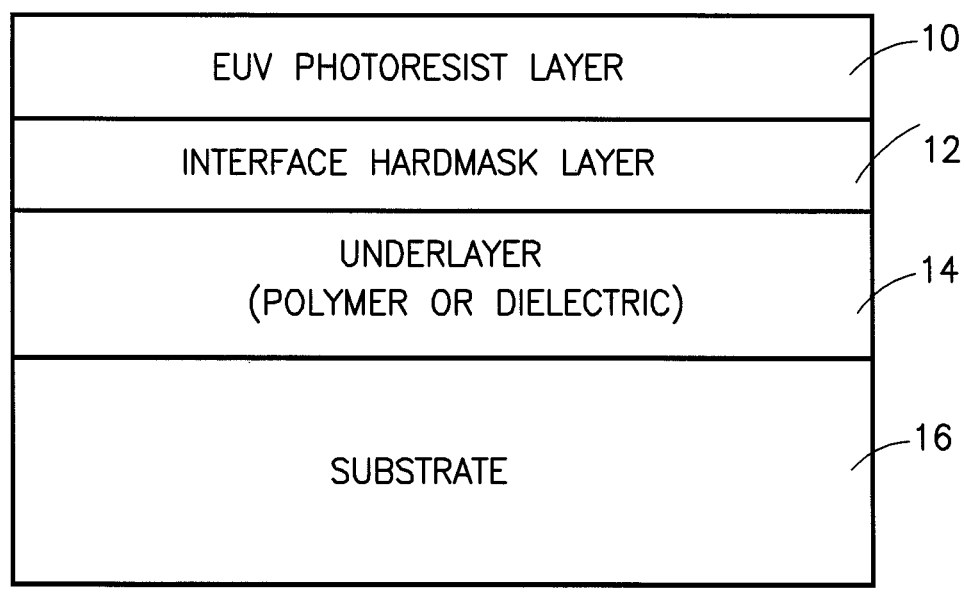
FIG. 3 shows an enlarged cross-sectional view of a layer stack containing an interface hardmask layer that is interposed between an EUV photoresist layer and an underlayer and, beneath the underlayer, a substrate that is to be patterned, where the interface hardmask layer is tuned in accordance with embodiments of this invention to enhance secondary electron yield to facilitate PAG development in the EUV photoresist layer.

Referring to FIG. 3, and in accordance with a non-limiting embodiment of this invention, the interface layer is embodied as an interface hardmask layer 12 that is interposed between an EUV photoresist layer 10 and an underlayer 14 such as an OPL. The EUV photoresist layer 10 can be composed of any desired type of EUV-responsive resist material and can be applied by any conventional process, such as by spinning-on the resist from a liquid precursor. Beneath the underlayer 14 is a substrate 16 of arbitrary thickness that is to be patterned in accordance with features to be developed in the EUV photoresist layer 10. The top planar surface of the substrate 16 can be smooth or it can be patterned. The interface hardmask layer 12 is engineered and configured to both generate secondary electrons and to control travel of the secondary electrons back to the resist layer 10. This configuration of the interface hardmask layer 12 can be accomplished by, as non-limiting examples, adjusting the molecular composition of the interface hardmask layer 12 (for example, by using an interface hardmask layer 12 comprised of a metal oxide); by adjusting the density of the interface hardmask layer 12; and/or by adjusting a degree of oxidation of the interface hardmask layer 12. The desired result and effect is to tune the secondary electron yield of the interface layer that is embodied as the interface hardmask layer 12.

One significant advantage that is gained by the use of the embodiments of this invention is the provision of a tunable surface of the thin interface hardmask layer 12 that functions to enhance PAG development in the EUV exposed resist 10, thereby enabling a reduction in a required EUV dose.

The use of the embodiments of this invention can thus control/optimize secondary electron generation at the boundary of the resist/interface hardmask layer in order to enable a reduction in the required EUV dose, and also potentially improve pattern fidelity and lithographic process windows.

The EUV resist 10 is deposited on top of the tuned surface of the interface hardmask layer 12. As employed herein 'tuning' the surface of the interface layer refers to controlling material properties and/or the composition of the interface hardmask layer 12 to establish a certain desired secondary electron yield at the interface layer. In accordance with some non-limiting embodiments of this invention the interface hardmask layer 12 can be comprised of at least one of Me; MeO; MeC; MeCO; MeN; MeON; and MeCON, where Me stands for a transition metal (i.e., the 38 elements in groups 3 through 12 of the periodic table), and where N is nitrogen, O is oxygen and C is carbon. Non-limiting examples of suitable transition metals include, but are not limited to: Ti, Al, Ta, Cu, W, Ga, Mn, Co, Hf; La and other metals with higher Z number. In accordance with some further non-limiting embodiments of this invention the interface hardmask layer 12 can be comprised of; where applicable, oxides of these metals, carbides of these metals, nitrides of these metals and silicides of these metals. The thickness of the interface hardmask layer 12 can be in an exemplary range of about 1 nm to about 10 nm; although thinner or thicker interface hardmask layer layers can be employed. The interface hardmask layer 12 can be deposited by any deposition process suitable for forming a thin material layer, for example, chemical vapor deposition (CVD), plasma enhanced CVD (PECVD), physical vapor deposition (PVD) and atomic layer deposition (ALD). Preferably the interface hardmask layer 12 is deposited at a (relatively) low temperature (typically <300° C.) to avoid melting, deformation and/or outgassing of the underlying layer 14 of; for example, OPL.

As a non-limiting example, assume a case of the resist layer 10 being deposited directly on a surface of a crystalline, e.g., <100>, Si substrate 16, with some lithographic feature dose (D) to size ratio for an 18 nm line/space feature. For the same feature size, but where the resist layer 10 is deposited on a W (tungsten) interface hardmask layer 12, the dose can be reduced to about 88% of D, while for the same feature size but where the resist layer 10 is deposited on an ODL/SiARC (Si-containing anti-reflection coating) stack that would function as the interface hardmask layer 12 the dose can be reduced to about 65% of D. In the latter case the polycrystalline Si of the SiARC can be considered to function in a manner analogous to a metal. The EUV exposure dose to size ratio can be seen to be sensitive to the underlayer material, indicating the significance of the secondary electron yield in the exposure.

In accordance with embodiments of this invention tuning of secondary electrons yields at the interface hardmask layer 12 can be controlled by one or more of the following.

In one non-limiting example the thin interface layer (a precursor to the interface hardmask layer 12) is deposited as a pure transition metal, followed by exposure to one or more plasmas at various temperatures ranging from about room temperature to about 500° C. The plasma can contain oxygen as well as other species such as, but not limited to, nitrogen or hydrogen or ammonia, to produce a thin surface layer (e.g., 1 nm-10 nm thick depending on plasma condition and temperature) of either pure transition metal oxide (in case of pure oxygen plasma) or nitride (in case of ammonia or nitrogen). By combining various plasma species it is possible to achieve a more complex surface layer composition such as, for example, MeON. Note in this regard that oxidative treatments are typically preferred due to the danger of poisoning organic layers and resist with nitrogen. Another oxidative method that may be preferred for compatibility with a potentially organic underlayer 14 could involve exposure of the metal interface hardmask layer 12 to oxygen at an elevated temperature, e.g., a temperature (lower than that of plasma treatment) in a range of about 100° C.-150° C.

In another non-limiting example surface modification of the interface hardmask layer 12 can be achieved by ion implantation (or a combination of implantation and other treatments, such as a low temperature anneal) of materials with higher secondary electron yields. For example, a film composed of a pure transition metal can be implanted by a variety of species (e.g., oxygen, carbon, nitrogen, or silicon) to modify the composition of just the top surface layer or completely through the metal layer thickness depending on implant dose and energy. Implantation can typically be performed at room temperature. After implantation the film can be annealed at a temperature of up to about 500° C. to ensure both the reaction of the metal with the implanted species and the stability of the underlayer 14. The end result is the formation of the interface hardmask layer 12 having the desired properties. The anneal duration can range from seconds to hours depending on the metal and a desired thickness of the oxidized surface layer ($Me_xO_y$).

The ion implantation technique can provide a uniform surface composition as well as film bulk (sub-surface) properties depending on implant conditions and implant species diffusion during the anneal. It should be noted that millisecond and shorter duration types of anneals (e.g., flash anneals) may be also used at higher temperatures above 500° C. to reduce the possibility of adversely affecting the underlayer 14.

In another non-limiting example one can control the degree of an amorphous characteristic of the film structure. In that the interface hardmask layer 12 microstructure can enhance secondary electron generation, a variety of amorphous and polycrystalline films can be deposited depending on process conditions. For example, certain films can exhibit a greater surface area depending on whether the film is amorphous or polycrystalline. Post-treatments such as post deposition anneals can be used to create a desired microstructure for a particular metal system.

Further in accordance with embodiments of this invention, tuning of the composition of the interface hardmask layer 12 can involve one or more of the following.

Ternary film composition: $Me_xO_y$, or more complex ternary films such as $Me_xO_yC_z$ for example can be deposited with a high level of control. In this case the values of x, y and z are adjusted to achieve the desired degree of secondary electron yield at the interface hardmask layer 12 and the interface with the EUV resist layer 10.

Further in this regard Walker et al. (Scanning, Vol. 30, 365-380 (2008), The Secondary Electron Emission Yield for 24 Solid Elements Excited by Primary Electrons in the Range 250-5000 ev: A Theory/Experiment Comparison, C. G. H. Walker, M. M. El-Gomati, A. M. D. Assa'd, and M. Zadražil) have shown secondary electron emission yields for a range of metallic compounds, and determined that secondary electron emission (SEE) is largely dominated by effects induced by oxidation for certain metals (e.g., Al, Zr, Hf).

Figure 4A:
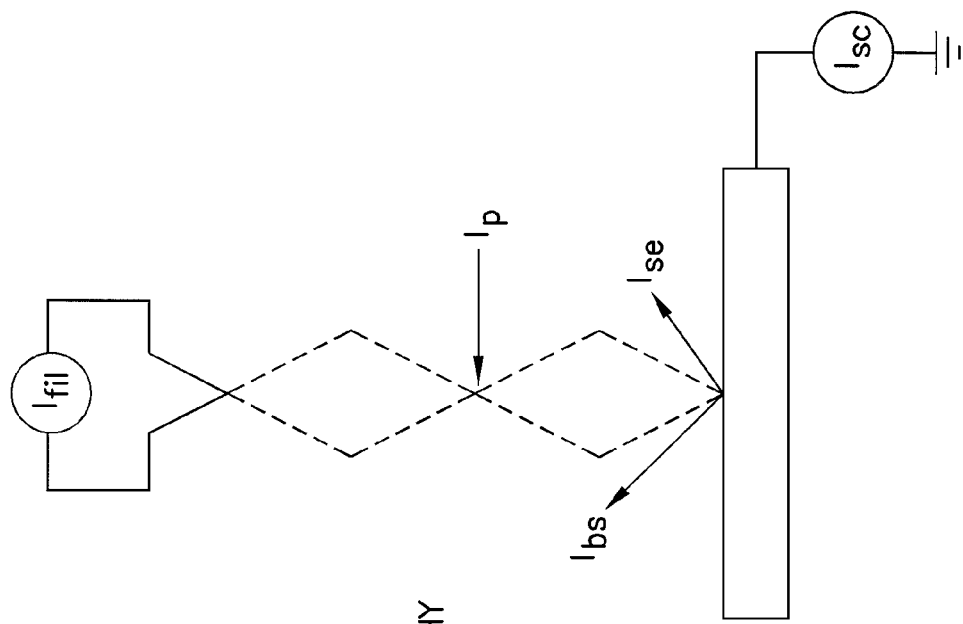
Figure 4B:
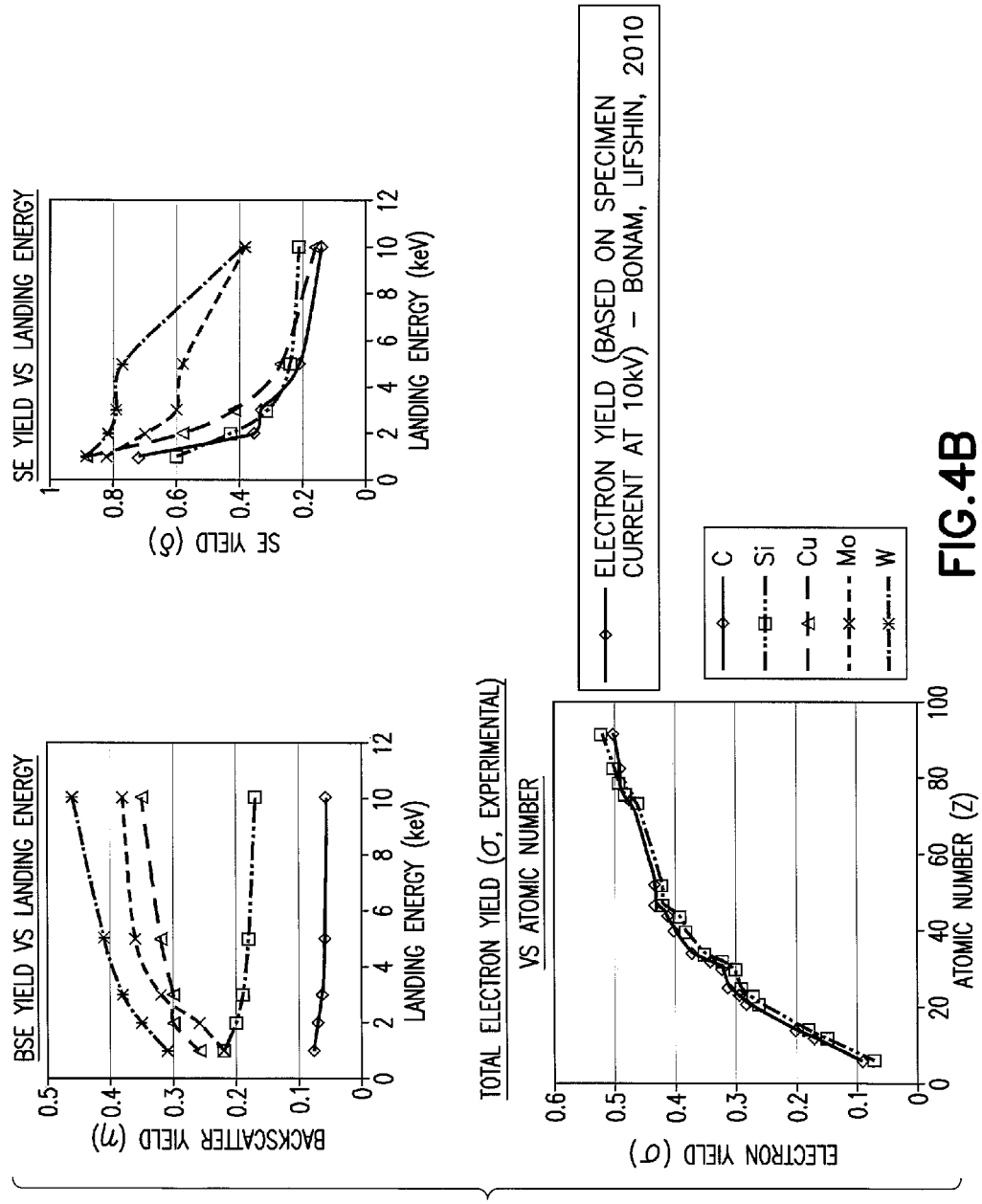

It is noted that there are a variety of techniques for measuring electron yields. For one non-limiting example reference can be made to FIGS. 4A-4C. FIG. 4A shows an electron beam circuit model for electron component measurements. FIG. 4B depicts three graphs showing backscatter secondary electron (BSE) yield vs. landing energy for several metals, secondary electron (SE) yield vs. landing energy for the same metals and total electron yield vs. atomic number. FIG. 4C shows a list of SE yields for a number of common metals. A desired SE yield is generally about two times or more secondary electrons per incident photon/interaction.

Oxidative post treatment: The interface hardmask layer 12 composition and metal-to-oxygen ratio can be controlled by varying process parameters and/or by oxidative post treatments that oxidize a full thickness of the interface hardmask layer 12 in order to tune the density of the interface hardmask layer, the wet/RIE etch rates, as well as an amount of secondary electrons generated at the boundary of the resist/interface hardmask layer.

It can be noted in this regard that due to the desired thinness of the interface hardmask layer 12 most basic low temperature oxidation processes (typically those that are oxygen/ozone plasma based) are capable of penetrating the full thickness of the interface hardmask layer 12 (e.g., about 1 nm-10 nm) and can thus achieve complete oxidation throughout the film thickness. In general oxidation processes depend on plasma penetration depth in solids (typically about 10 Å-20 Å) as well as oxygen diffusion coefficients at some particular temperature.

Balanced properties control: The density of the interface hardmask layer 12, the wet/RIE etch rate as well as optical and mechanical properties are defined by the final film composition. A compromise can thus be reached between the secondary electron yield and the desired properties of the interface hardmask layer.

Adhesion to resist: The composition of the interface hardmask layer can differ from that of a pure metal in order to improve adhesion to the resist layer 10 and to ensure the interface hardmask layer 12 can be stripped after the patterning process as well as to allow rework if needed. In general, an amine (NH) containing hardmask is not preferred due to a possibility of introducing a resist poisoning issue.

Adhesion of the metal-based interface hardmask layer 12 to the EUV resist 10 is defined by composition as well by the film post-treatment (e.g., by plasma, thermal and/or implant-based post-treatments.

The use of the embodiments of this invention enables a number of advantages to be realized. These advantages include, but are not limited to, providing an interface hardmask layer that is tuned for enhancing EUV secondary electron generation into an overlying resist layer. The interface hardmask layer beneficially reduces the exposure dose (to size) relative to a conventional polymer or oxide.

The advantages further include, but are not limited to, providing a metal-containing underlayer (the interface hardmask layer) that also serves as a patterning hardmask and that can be deposited by ALD/CVD/PVD/PECVD and other types of thin film deposition techniques. As deposited Me or $Me_xO_y$ films and/or oxidation processes can be used. The transition from oxide to pure metal and the degree of oxidation can be tuned to optimize lithography/dose performance.

The advantages further include, but are not limited to, providing enhanced sensitivity through higher EUV absorption with the presence of high Z atoms and/or post deposition treatments.

The advantages further include, but are not limited to, providing methods for increasing secondary electron yield using one or more of plasma treatments and low energy implants of some desired chemical specie(s).

The advantages further include, but are not limited to, providing increased secondary electron yield through the tuning of the morphology of the interface hardmask layer 12. The morphology can be that of metals and oxides based on, for example, crystallography and crystalline defect structure. The morphology can also be that of disordered materials.

The advantages further include, but are not limited to, providing increased secondary electron yield through the use of a thin interface hardmask layer 12 that is processed at a temperature less than the melting point of the underlayer 14. In one non-limiting example the interface hardmask layer 12 is processed at a temperature that is less than about 500° C. In another non-limiting example the interface hardmask layer 12 is processed at a temperature in a range of about <250° C. to about 300° C. The advantages further include, but are not limited to, providing the interface hardmask layer 12 to be removable during an etching step (wet or dry etch), where the interface hardmask layer 12 can function as an etch hardmask.

The advantages further include, but are not limited to, providing the interface hardmask layer 12 that is configured to and that enables direct RIE/patterning.

In general, and preferably, the desired thickness of the interface hardmask layer 12 is such that it would not be readily achievable by conventional spin-on processing techniques. Instead a variety of vapor phase deposition and atomic layer deposition techniques can be used to deposit the interface hardmask layer 12. As was noted above, a desired thickness of the interface hardmask layer 12 can be in a range of about 1 nm to about 10 nm, although thicker and thinner films can be employed if desired.

The embodiments of this invention further provide a method and a process for tuning an interface hardmask layer that underlies an EUV resist layer to enhance and optimize the generation of secondary electrons capable of propagating within the EUV resist layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent materials and/or deposition processes and/or layer thicknesses and/or temperature ranges may be used by those skilled in the art. However, all such and similar modifications of the teachings of this invention will still fall within the scope of this invention.

What is claimed is:

1. A method to prepare a substrate for photolithography, comprising:
   forming an underlayer over a surface of the substrate;
   depositing an interface hardmask layer on the underlayer using one of a vapor phase deposition process or an atomic layer deposition process; and
   forming a layer of extreme UV (EUV) resist on the interface hardmask layer, where
   the interface hardmask layer is comprised of material having a composition and properties tuned to achieve a certain secondary electron yield from the interface hardmask layer;
   where the interface hardmask layer is tuned by depositing the interface hardmask layer as a metal oxide layer or by depositing the interface hardmask layer as a metal layer and subsequently oxidizing the metal layer to a predetermined degree of oxidation to optimize a lithographic feature dose to size characteristic.

2. The method as in claim 1, where the interface hardmask layer is comprised of at least one of: Me; MeO; MeC;

MeCO; MeN; MeON; and MeCON, where Me stands for a transition metal, and where N is nitrogen, O is oxygen and C is carbon.

3. The method as in claim 1, where the interface hardmask layer is comprised of at least one of: Ti, Al, Ta, Cu, W, Ga, Mn, Co, Hf, La and other metals with higher Z number, oxides of these metals, carbides of these metals, nitrides of these metals and silicides of these metals.

4. The method as in claim 1, where a thickness of the interface hardmask layer is in a range of about 1 nm to about 10 nm.

5. The method as in claim 1, where depositing the interface hardmask layer is accomplished at a temperature less than a melting temperature of a material that comprises the underlayer.

6. The method as in claim 1, where the underlayer is comprised of at least one of a dielectric and an optical planarizing layer (OPL), and where depositing the interface hardmask layer is accomplished at temperature selected to avoid outgassing from the underlayer.

7. The method as in claim 1, where the interface hardmask layer is comprised of a transition metal and is tuned by implanting oxygen ions into the interface hardmask layer and annealing the implanted interface hardmask layer to create an oxidized form of the transition metal.

8. The method as in claim 1, where the interface hardmask layer is tuned by at least one of controlling a microstructure of the interface hardmask layer and controlling a degree of crystallinity of the interface hardmask layer ranging from amorphous to polycrystalline to crystalline.

9. The method as in claim 1, where the interface hardmask layer is tuned by exposing the deposited interface hardmask layer to at least one plasma.

10. The method as in claim 1, where the interface hardmask layer is tuned by controlling binary x, y or ternary x, y and z relative composition values of elements that comprise the interface hardmask layer.

11. A structure configured for photolithography, comprising:
    a substrate;
    an underlayer over a surface of the substrate;
    an interface hardmask layer disposed on the underlayer; and
    a layer of extreme UV (EUV) resist disposed on the interface hardmask layer, where
      the interface hardmask layer is comprised of material having a composition and properties tuned to achieve a certain secondary electron yield from the interface hardmask layer, where the interface hardmask layer comprises a metal oxide layer or a metal layer, and where the metal oxide layer or the metal layer comprises an oxidation layer oxidized to a predetermined degree of oxidation to optimize a lithographic feature dose to size characteristic.

12. The structure as in claim 11, where the interface hardmask layer is comprised of at least one of: Me; MeO; MeC; MeCO; MeN; MeON; and MeCON, where Me stands for a transition metal, and where N is nitrogen, O is oxygen and C is carbon.

13. The structure as in claim 11, where the interface hardmask layer is comprised of at least one of: Ti, Al, Ta, Cu, W, Ga, Mn, Co, Hf, La and other metals with higher Z number, oxides of these metals, carbides of these metals, nitrides of these metals and silicides of these metals.

14. The structure as in claim 11, where a thickness of the interface hardmask layer is in a range of about 1 nm to about 10 nm.

15. The structure as in claim 11, where the interface hardmask layer is tuned by implanting ions into the interface hardmask layer, where the interface hardmask layer is comprised of a transition metal and is tuned by implanting oxygen ions into the interface hardmask layer and annealing the implanted interface hardmask layer to create an oxidized form of the transition metal.

16. The structure as in claim 11, where the interface hardmask layer is tuned by controlling one or both of a microstructure of the interface hardmask layer and a degree of crystallinity of the interface hardmask layer ranging from amorphous to polycrystalline to crystalline.

17. The structure as in claim 11, where the interface hardmask layer is tuned by controlling binary x, y or ternary x, y and z relative composition values of elements that comprise the interface hardmask layer.

18. A method to prepare a substrate for photolithography, comprising:
    forming an underlayer over a surface of the substrate;
    depositing an interface hardmask layer on the underlayer using one of a vapor phase deposition process or an atomic layer deposition process; and
    forming a layer of extreme UV (EUV) resist on the interface hardmask layer, where
    the interface hardmask layer is comprised of material having a composition and properties tuned to achieve a certain secondary electron yield from the interface hardmask layer;
    where the interface hardmask layer is tuned by implanting ions into the interface hardmask layer.

* * * * *